United States Patent
Hamilton et al.

(10) Patent No.: US 11,670,555 B2
(45) Date of Patent: Jun. 6, 2023

(54) PCM METAL SHIELDING FOR WAFER TESTING

(71) Applicant: pSemi Corporation, San Diego, CA (US)

(72) Inventors: Jacob Hamilton, San Diego, CA (US); Tran Kononova, San Diego, CA (US); Jay Kothari, San Diego, CA (US); Matt Allison, Oceanside, CA (US); Kim T. Nguyen, San Diego, CA (US); Eric S. Shapiro, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 251 days.

(21) Appl. No.: 17/127,884

(22) Filed: Dec. 18, 2020

(65) Prior Publication Data

US 2022/0199475 A1    Jun. 23, 2022

(51) Int. Cl.
| H01L 21/66 | (2006.01) |
| H01L 23/00 | (2006.01) |
| G01R 31/28 | (2006.01) |
| H01L 23/58 | (2006.01) |

(52) U.S. Cl.
CPC ......... *H01L 22/32* (2013.01); *G01R 31/2884* (2013.01); *H01L 23/562* (2013.01); *H01L 23/564* (2013.01); *H01L 23/585* (2013.01)

(58) Field of Classification Search
CPC ..... H01L 22/32; H01L 23/562; H01L 23/564; H01L 23/585; H01L 2924/3025; H01L 23/5225; H01L 22/34; G01R 31/2884
USPC ............. 324/762.03, 762.01, 537, 500
See application file for complete search history.

(56) References Cited

U.S. PATENT DOCUMENTS

| 7,679,195 | B2 | 3/2010 | Chen |
| 7,679,384 | B2 | 3/2010 | Chen et al. |
| 8,426,855 | B2 | 4/2013 | Chen |
| 8,994,397 | B2 | 3/2015 | Gibbs et al. |
| 9,059,189 | B2* | 6/2015 | Keller, III ............... G06F 21/44 |
| 2014/0176174 | A1* | 6/2014 | Preston .............. G01R 31/2886 355/77 |
| 2017/0047442 | A1* | 2/2017 | Kumano ............... H01L 23/585 |
| 2020/0088787 | A1 | 3/2020 | Ochotorena, Jr. et al. |
| 2020/0341191 | A1* | 10/2020 | Meade ................. G01R 31/311 |
| 2021/0287950 | A1* | 9/2021 | Lin .................... H01L 23/49503 |
| 2023/0014148 | A1* | 1/2023 | Liao ................. G01R 31/31722 |

\* cited by examiner

*Primary Examiner* — Giovanni Astacio-Oquendo
(74) *Attorney, Agent, or Firm* — Steinfl + Bruno, LLP

(57) ABSTRACT

Method and devices to reduce integrated circuit fabrication process yield loss due to undesired interactions between PCMs and the wafer test probes during wafer sorting tests are disclosed. The described methods entail the use of a properly patterned metal layer on the PCM dies adjacent to the product dies under test. Such patterned metal layers shield traces of the wafer probes from the circuits of the PCM dies. Various exemplary metal layer patterns are also presented.

24 Claims, 9 Drawing Sheets

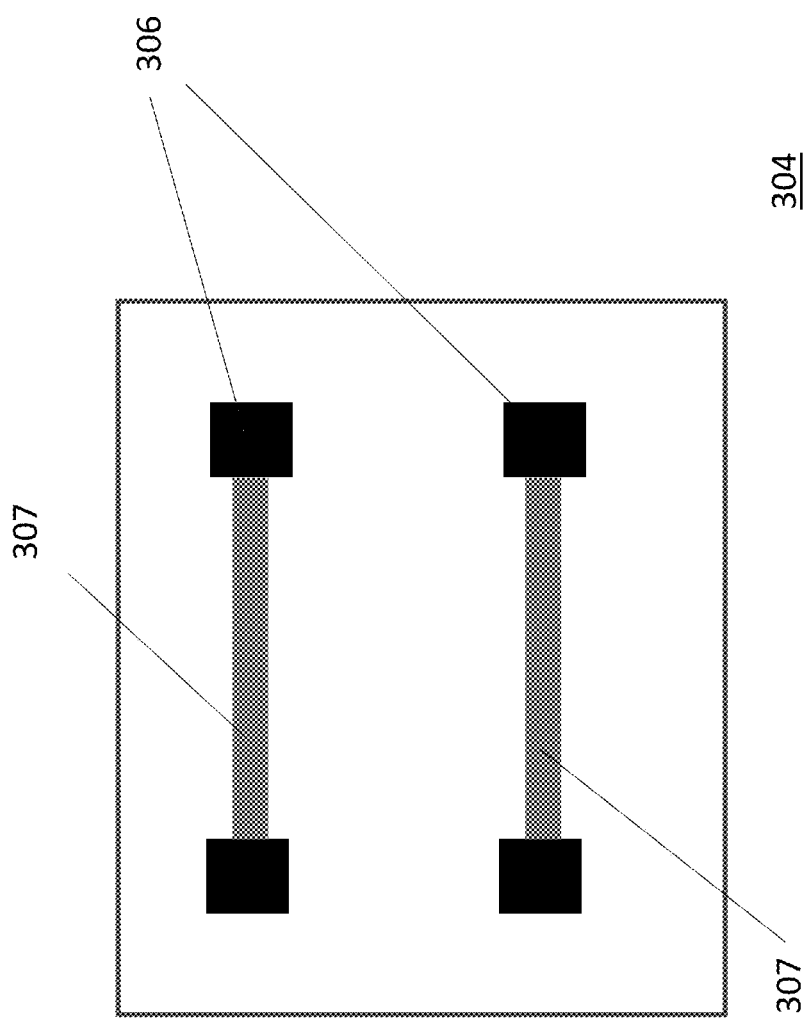

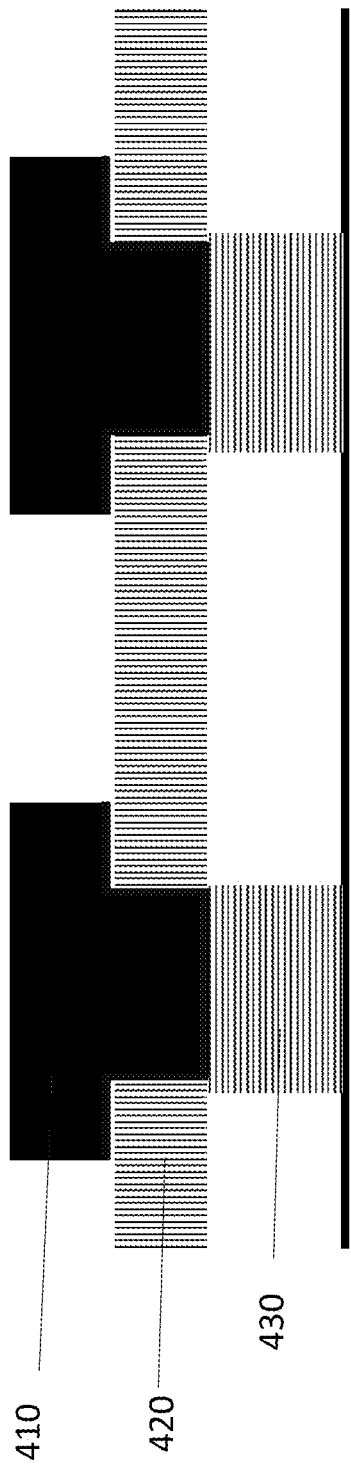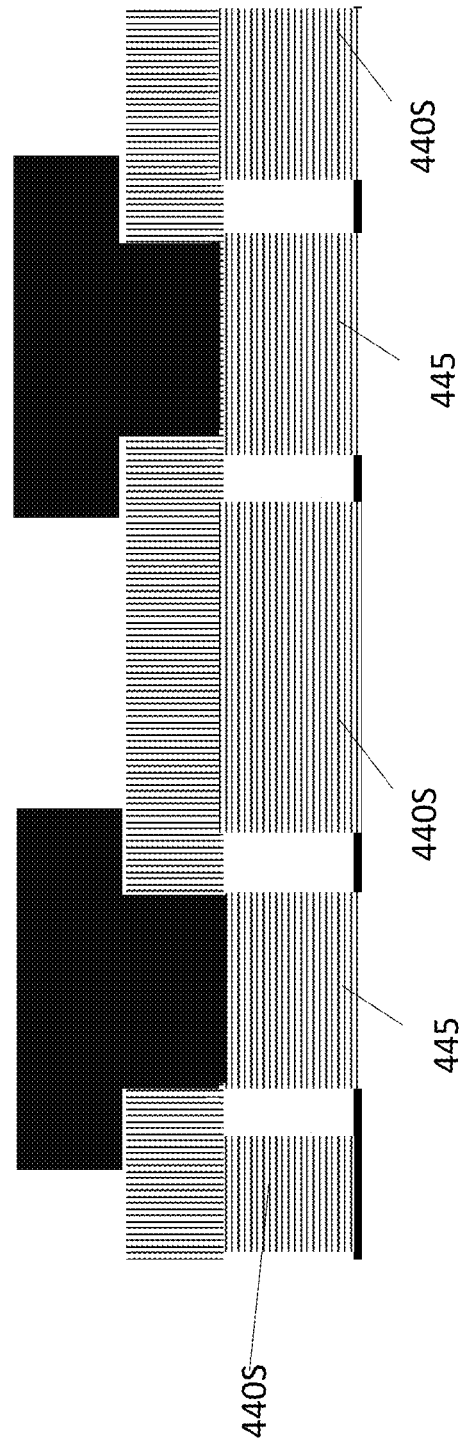

PCM METAL SHIELDING FOR WAFER TESTING

FIELD

The present disclosure is related to wafer level testing, more in particular to methods and devices to shield process control monitor (PCM) structures during wafer testing for improved yield.

BACKGROUND

In integrated circuit (IC) design and manufacturing, as shown in the schematic top view of FIG. 1A, a wafer (100) is typically divided into several reticles (101) each containing a plurality of dies (102). With reference to FIG. 1B, in between dies (102), a thin spacing (110), usually called "street", is foreseen to provide sufficient clearance and prevent damage to the die during the dicing process.

As part of the overall design and production process, different types/levels of testing and verification are required. Wafer acceptance testing (WAT) involves using process control monitor (PCM) data and statistical methods to analyze the success of the wafer fabrication process and to determine the cause of any fabrication deficiencies. As shown in the schematic top view of FIG. 1B, PCMs (120) are test structures that may be placed in the streets (110). In order to optimize the use of real estate on the wafer and therefore improve the overall cost, narrower streets are highly desired. As such, PCMs may be placed in the die locations instead of the streets, thereby enabling the design of narrower streets. Although a few dies are sacrificed to be used for PCM placements, such approach enables the fabrication of a larger number of dies on a wafer, resulting in an overall reduction of the product cost.

Throughout this document, the term "prime die" will refer to a product die, while the term "PCM die" will refer to a die containing PCM structures.

The process of testing which product dies are good and which are not is called wafer sort which is implemented using another set of tests also performed during semiconductor device fabrication. During this step, performed before a wafer is sent for wafer dicing, individual integrated circuits that are present on the wafer are tested for functionality by applying special test patterns to them. The wafer testing is usually performed by a piece of test equipment called an automatic test equipment (ATE). A very high yield (e.g. greater than 99%) is often desired for the overall fabrication process. To achieve this, the wafer sort testing is required to be very accurate and reliable.

Issues may arise during the wafer sorting test, resulting in significant yield losses. In order to describe such issues, reference is made to FIG. 2A showing a schematic cross sectional view of a wafer probe test setup (200A) including a wafer probe (220) used to test a prime die (203) adjacent to a PCM die (204). Due to the proximity of traces (e.g. RF traces) or lines (221) of the wafer probe (220) to circuitry such as active devices within PCM die (204) during the test, undesired RF signals may be picked up by the probe (220), thereby interfering with the test of the device under test disposed on prime die (204) device under test (DUT), potentially negatively impacting the results of such tests.

The overlap of high power RF traces used in the wafer probe over active PCM structures as described above may have severe negative impacts on the test such that a possibly good/healthy die such as prime die (203) may be falsely labeled as a bad/failed die. This results in an undesired or false overall yield loss. FIG. 2B is an exemplary illustration of the described problem. Wafer (200B) shown in FIG. 2B includes several reticles (201) each comprising a plurality of dies. Several PCM dies (204) are arranged vertically in the reticle (201) and presented on the right side of the figure using diagonal stripes. Prime dies (203) surrounding and in the vicinity of PCM dies (204) are shown on the right side of the figure using horizontal stripes. Such prime dies are the most exposed to the interference due to the interactions between RF traces on the wafer probe and PCM dies, and as a result may falsely fail the wafer-level test.

The interference issue described above is exacerbated when the devices under test are required to be tested with higher power. The inventors have confirmed the presence of such interference issues by performing wafer sorting test of wafers at higher powers. The sorting test entailed harmonic measurements of prime dies. Given the nature of the designed circuits, high power was required to be applied to the device under test, e.g. 33 dBm or 35 dBm, which is a value higher than typical power levels applied during wafer level testing. These structures on the wafer can cause a complete reflection effect that creates an effective 6 dB higher power at the device under test than what is applied by the test instrumentation. This results in a higher exposure of the test setup and wafer to the interference issues described above and, as a result, a repeating pattern of failed dies near the PCM dies (e.g. die (203)) was observed, while prime dies not in proximity of the PCM dies (e.g. die (202)) passed the same test.

One solution to the described interference issue is to shield RF traces on the wafer probe. This approach only partially resolves the problem, e.g. the yield loss may improve by 50%, which is still not acceptable given the stringent overall yield requirements in a majority of applications.

In view of the above, and also due to the increasing demand for higher power RF testing during production, there is therefore a need for a wafer level testing that dramatically reduces the interaction of traces such as RF traces with active PCMs as described above to achieve the required/desired overall yield of the fabrication process.

SUMMARY

The disclosed methods and devices address the above-described problems encountered during wafer sorting tests, and provide solutions to reduce the resulting false yield loss.

According to a first aspect, a wafer comprising a plurality of dies including a first die and a second die adjacent to or in proximity of the first die is disclosed, wherein: the first die comprises a device under test configured to receive radio frequency (RF) test signals through a wafer probe for wafer testing, the wafer probe including traces to conduct the RF test signals; the second die comprises test pads, circuits and a patterned metal layer patterned to electrically shield the traces conducting the RF test signals applied to the first die from the circuits in the second die, the test pads being electrically isolated from the patterned metal layer.

According to a second aspect, a wafer testing method is disclosed, comprising: providing a wafer comprising a plurality of dies including a first die and a second die being adjacent to or in proximity of the first die, the second die comprising circuitry, test pads and a patterned metal layer patterned to leave the test pads accessible for testing through openings in the patterned metal layer, the test pads being electrically isolated from the patterned metal layer; providing a wafer probe comprising traces; and applying radio frequency (RF) test signals to the first die through the traces of the wafer probe while shielding the traces from the circuitry of the second die by the patterned metal layer of the second die.

Further aspects of the disclosure are provided in the description, drawings and claims of the present application.

DESCRIPTION OF THE DRAWINGS

FIG. 3A shows a top view of a prior art PCM die.

FIG. 4A show a cross-sectional view of a prior art PCM die.

FIG. 4B shows a cross-sectional view of an exemplary PCM die according to an embodiment of the present disclosure.

DETAILED DESCRIPTION

Figure 1A:
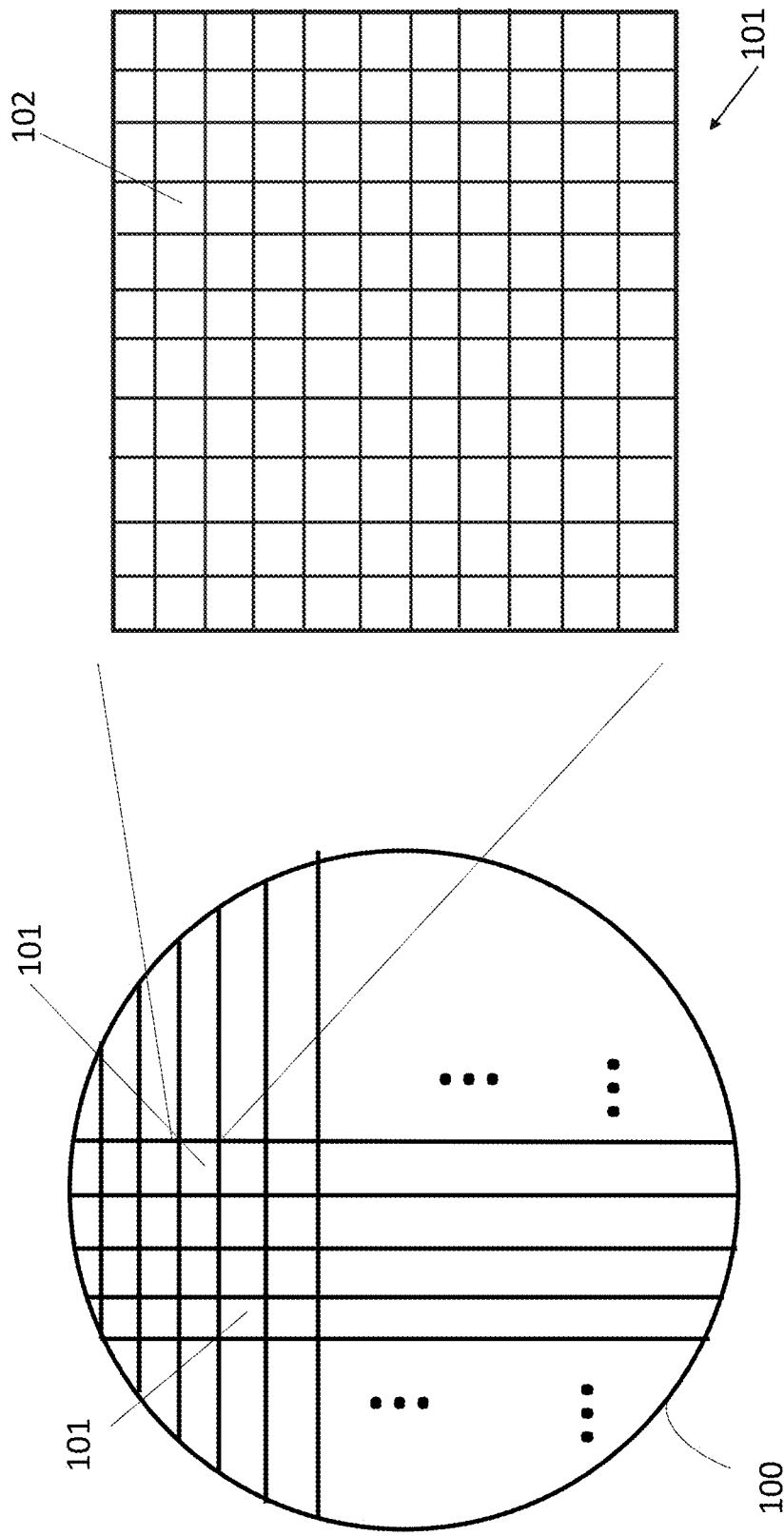
FIG. 1A shows a prior art wafer with a plurality of reticles.
Figure 1B:
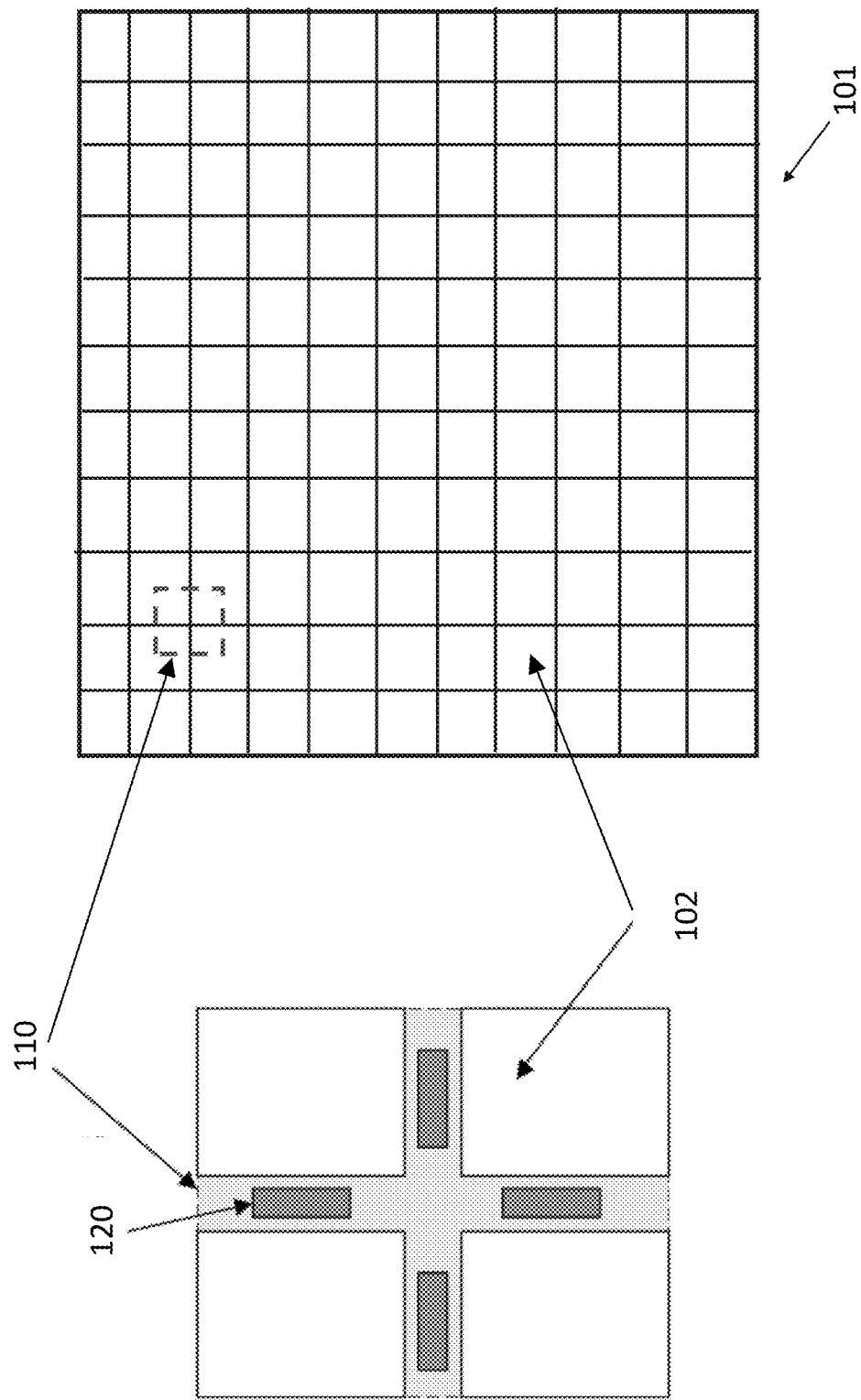
FIG. 1B shows a prior art reticle with several dies, streets in between dies, and test structures disposed in the streets.
Figure 2A:
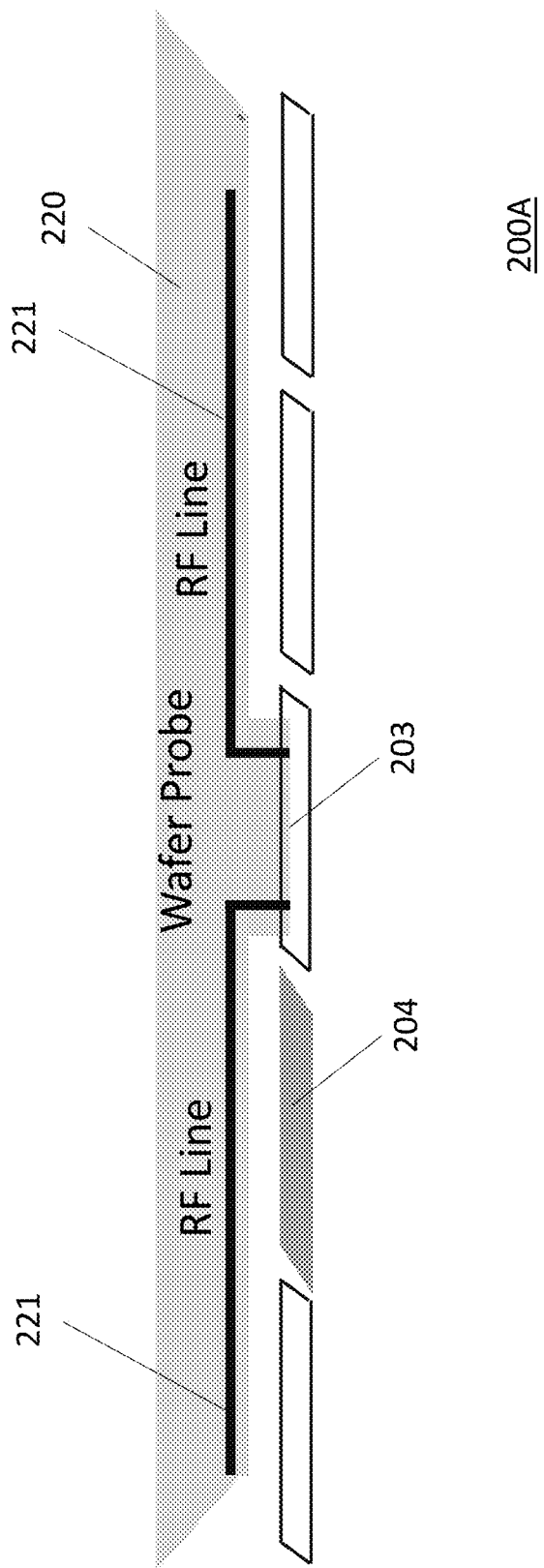
FIG. 2A shows a prior art wafer probe testing setup.
Figure 2B:
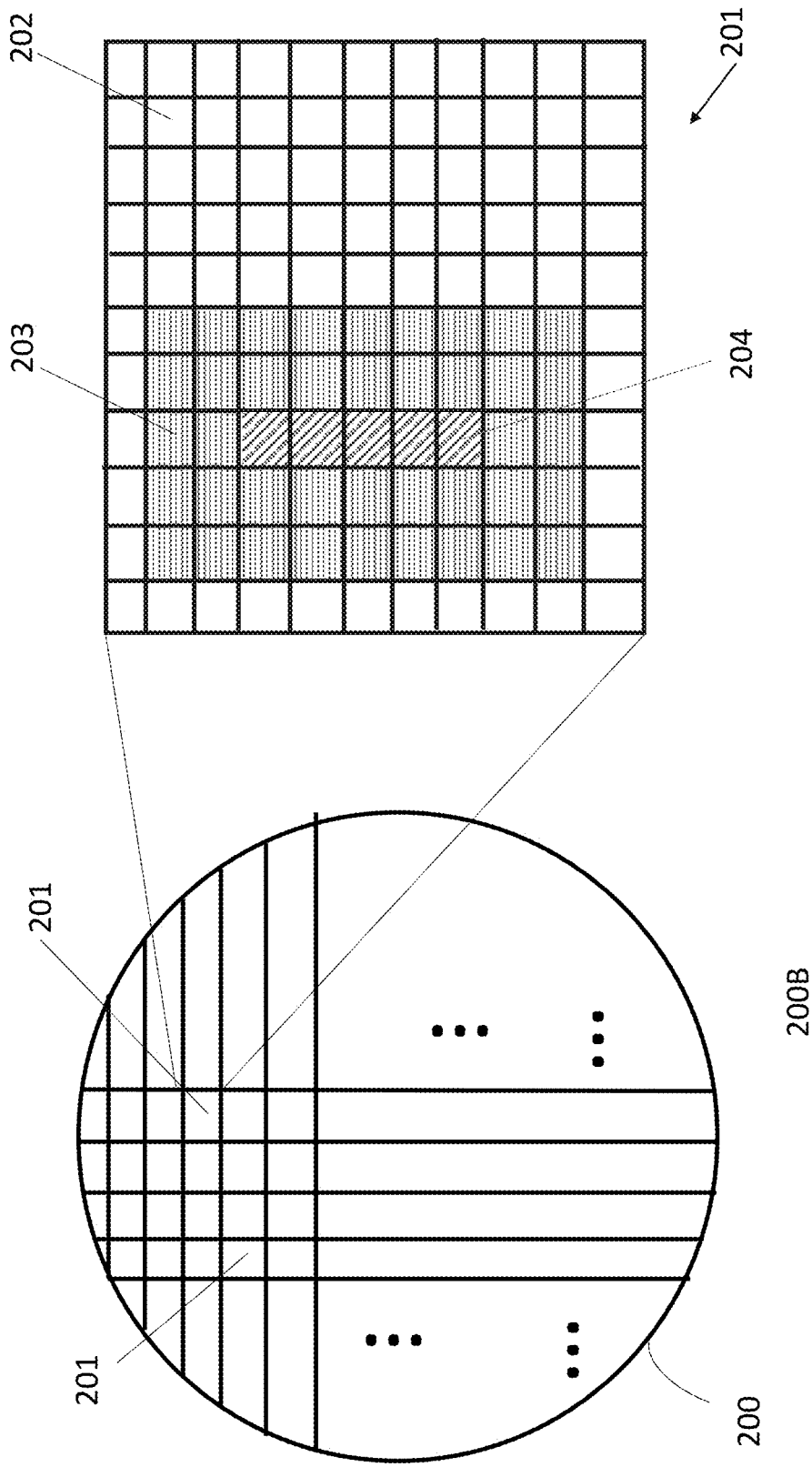
FIG. 2B shows an arrangement of PCM and prime dies in a reticle.

Throughout the present disclosure the term "seal ring" is used to refer to a structure fabricated on the perimeter of a die as part of integrated circuits fabrication process. The seal ring structure is used to avoid introducing die-sawing stress and contaminants into the circuits of the chip. Therefore, the circuits of the whole chip can be enclosed by the seal-ring structure according to wafer foundry design rules.

The disclosed methods and devices involve shielding of the PCM structures. The inventors have demonstrated that the application of such methods to the fabrication process will reduce the yield loss issue as described previously.

According to an embodiment of the present disclosure, in order to prevent the RF interference of the probe RF traces due to the proximity of the probe to the circuitry (such as active devices) of the PCM dies during wafer testing, the PCM dies may be shielded using a metal pattern configured to sufficiently cover the PCM dies to reduce interaction/RF coupling between the PCM dies and the RF traces of the wafer probe during the testing process.

In general, after devices such as transistors and resistors have been fabricated in the silicon substrate, connections are made to link the circuits together. This process is called metallization, wherein metal layers are deposited on the wafer to form conductive pathways. In accordance with the embodiments of the present disclosure, a metal pattern may be used for the purpose of shielding the PCM dies. In other words, a metal layer, already being used as part of the fabrication process, is properly patterned to provide shielding of the PCM dies. When designing the pattern of the metal layer, care is exercised to avoid shorting to any other circuitry used in the layout of the PCM test structures. Throughout the present disclosure patterning of the top metal layer will be described by way of example. The person skilled in the art will however understand that patterning of other metal and/or conductive layers (e.g. copper, aluminum and/or tungsten layers) may be used for shielding the PCM dies from high power RF lines, even if such layers are not the topmost ones.

According to further embodiments of the present disclosure, the metal shield or pattern is integrated in the layout and may be tied to the seal ring coupled to substrate ground to divert the RF energy. The metal pattern may be designed with any type of mesh pattern, and the openings formed by the pattern may be smaller than one quarter of the test signal wavelength. Top layer metals made of aluminum, nickel, chromium, gold, germanium, copper, silver, titanium, tungsten, platinum, and tantalum may be used to form the desired pattern. Selected metal alloys may also be envisaged. The thickness of the top metal layer (or other metal layers used in the fabrication process) forming the pattern may be, for example, within the range of 50 nm to 3 um. The top layer metal pattern may be designed in-line with the requirements and rules (e.g. the maximum allowed density) imposed by the wafer foundry.

FIG. 3A shows a top view of an exemplary known PCM die (304) comprising test structures (307) coupled with test pads (306) used for testing purposes. Test structures (307) may include active circuitry. As mentioned before, during the wafer sorting test, when the wafer probe is used to test a structure of a product die (not shown) adjacent to or in proximity of PCM die (304), the interaction of the RF traces of the wafer probe with active circuits within the test structures (307) may impact negatively the measurements being performed on the product die, resulting in possible false results, especially in the case where RF test signals having higher powers are applied to the product die under test.

Figure 3B:
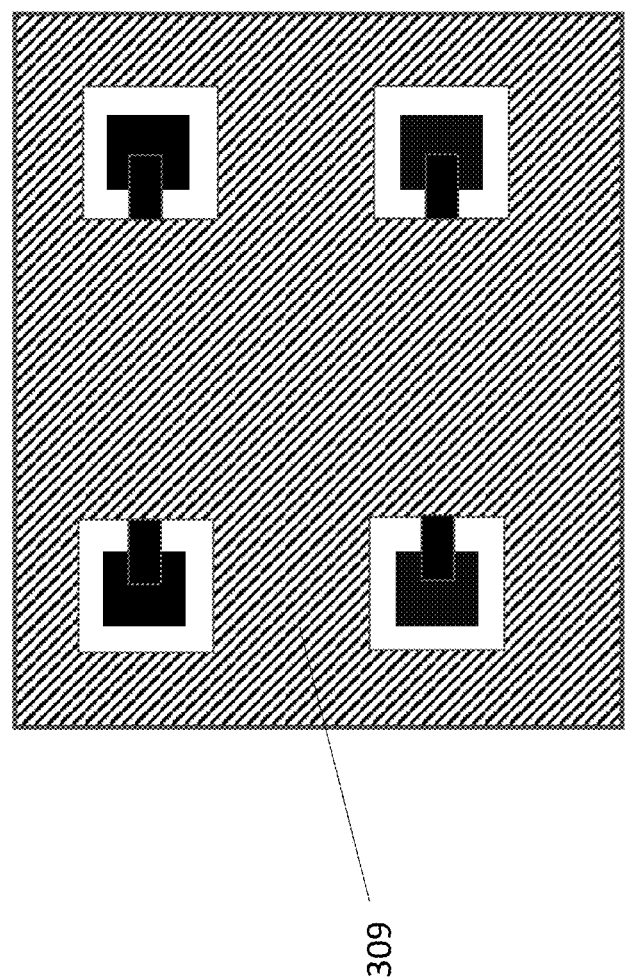
FIGS. 3B-3D show top views of exemplary PCM dies according to embodiments of the present disclosure.
Figure 3C:
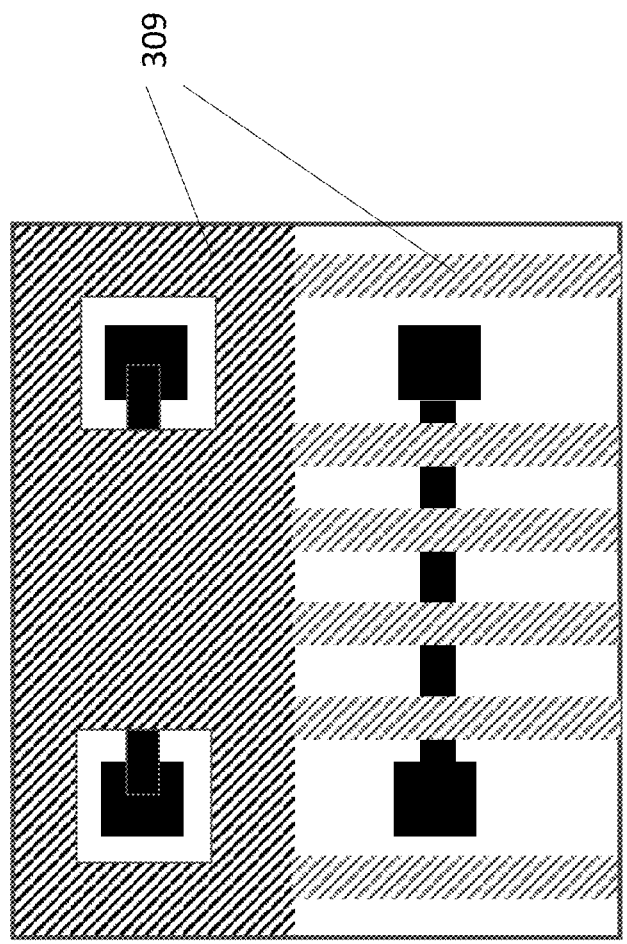
Figure 3D:
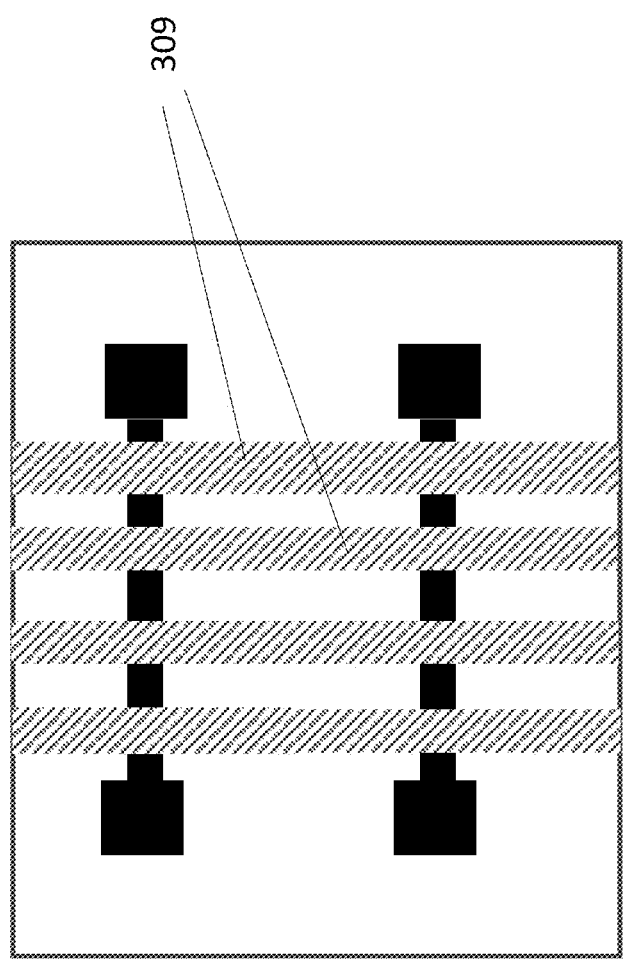

On the other hand, FIGS. 3B-3D show a top view of the same PCM die (300) this time shielded with a metal pattern (309), shown with diagonal stripes, deposited on the wafer. As can be seen in FIGS. 3B-3D, the pattern is such that the test pads (306) are not shorted. FIG. 3B shows a first example of metal pattern, uniformly distributed on top of a region of the PCM die of interest, with the exclusion of the test pads (306). FIG. 3C shows an alternative embodiment, where the pattern (309) is uniformly distributed in one region and striped in another region. FIG. 3D shows yet another embodiment, where the pattern (309) is striped along an entirety of the region of interest. The test patterns shown represent different top metal pattern densities and can be used for different applications. The person skilled in the art will appreciate that formation of the metal pattern according to the present disclosure on the top metal layer or other metal layers can be used in the same fabrication process of the PCM die. As such, the disclosed arrangements, methods and devices would entail practically no additional cost or extra fabrication process time. By way of example, the density of the pattern can be more than 50%, more than 80% or even more than 95% of the region of interest. It is also be noted that the PCM die (304) shown and described so far is an exemplary die, and other PCM dies with the same or different number of test structures and test pads may also be envisaged.

FIG. 4A shows a cross-sectional view of a known exemplary PCM die where no metal pattern shielding is applied. On the other hand, FIG. 4B shows a cross-sectional view of a PCM die according to the present disclosure where a metal pattern shielding has been applied in accordance with the previously disclosed teachings. In the exemplary embodiment of FIG. 4B, patterning of a metal layer different from the top layer is shown. Elements with solid black color, vertical stripes, horizontal stripes, and diagonal stripes represent test pads (410), passivation layer (420), copper layer (430) and the inventive metal pattern shield shown in the bottom layer of FIG. 4B, respectively. The pattern shown in the exemplary representation of FIG. 4B can comprise, by way of example, regions (445) substantially corresponding to the regions (430) shown in FIG. 4A and additional regions (440S) to obtain, in combination, the desired shielding properties.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz).

The invention claimed is:

1. A wafer comprising a plurality of dies including a first die and a second die adjacent to or in proximity of the first die, wherein:
    the first die comprises a device under test configured to receive radio frequency (RF) test signals through a wafer probe for wafer testing, the wafer probe including traces to conduct the RF test signals; and
    the second die comprises test pads, circuits and a patterned metal layer patterned to electrically shield the traces conducting the RF test signals applied to the first die from the circuits in the second die, the test pads being electrically isolated from the patterned metal layer.

2. The wafer of claim 1, wherein the patterned metal layer comprises openings to leave the test pads accessible for testing.

3. The wafer of claim 2, wherein the patterned metal layer has a mesh pattern, and wherein the openings of the patterned metal layer are smaller than one quarter of a wavelength of the RF test signals to be applied to the first die.

4. The wafer of claim 1, wherein the patterned metal layer is a topmost metal layer of the second die.

5. The wafer of claim 1, wherein the patterned metal layer is a non-topmost metal layer of the second die.

6. The wafer of claim 1, wherein the patterned metal layer fills more than 50% of an area of the second die.

7. The wafer of claim 6, wherein the patterned metal layer fills more than 80% of the area of the second die.

8. The wafer of claim 7, wherein the patterned metal layer fills more than 95% of the area of the second die.

9. The wafer of claim 1, wherein the circuits comprise active circuits.

10. The wafer of claim 1, wherein the patterned metal layer has a first region filling a first portion of an area of the second die, and a second region having a mesh pattern.

11. The wafer of claim 1, further comprising a substrate and a die with a seal ring, wherein the patterned metal layer is tied to the seal ring.

12. The wafer of claim 1, wherein the test pads of the second die are connected to process control monitors.

13. The wafer of claim 1, wherein the patterned metal layer has a thickness ranging from 50 nm to 3 um.

14. The wafer of claim 1, wherein the patterned metal layer is made of a material selected from the group consisting of aluminum, nickel, chromium, gold, germanium, copper, silver, titanium, tungsten, platinum, and tantalum.

15. A wafer testing method comprising:
    providing a wafer comprising a plurality of dies including a first die and a second die being adjacent to or in proximity of the first die, the second die comprising circuitry, test pads and a patterned metal layer patterned to leave the test pads accessible for testing through openings in the patterned metal layer, the test pads being electrically isolated from the patterned metal layer;
    providing a wafer probe comprising traces; and
    applying radio frequency (RF) test signals to the first die through the traces of the wafer probe while shielding the traces from the circuitry of the second die by the patterned metal layer of the second die.

16. The wafer testing method of claim 15, wherein the patterned metal layer has a mesh pattern with openings smaller than one quarter of a wavelength of the RF test signals.

17. The wafer of claim 15, wherein the patterned metal layer fills more than 50% of the area of the second die.

18. The wafer of claim 17, wherein the patterned metal layer fills more than 80% of the area of the second die.

19. The wafer of claim 18, wherein the patterned metal layer fills more than 95% of the area of the second die.

20. The wafer testing method of claim 15, wherein the patterned metal layer has a first region filling a first portion of an area of the second die, and a second region having a mesh pattern.

21. The wafer testing method of claim 15, wherein the second die further comprises process control monitors connected to the test pads.

22. The wafer testing method of claim 15, wherein the patterned metal layer has a thickness ranging from 50 nm to 3 um.

23. The wafer testing method of claim 15, wherein the patterned metal layer is made of a material selected from the group consisting of aluminum, nickel, chromium, gold, germanium, copper, silver, titanium, tungsten, platinum, and tantalum.

24. The wafer testing method of claim 15, wherein the circuitry comprises active circuits.

* * * * *